United States Patent
Viswanathan et al.

(10) Patent No.: US 8,161,421 B2
(45) Date of Patent: Apr. 17, 2012

(54) CALIBRATION AND VERIFICATION STRUCTURES FOR USE IN OPTICAL PROXIMITY CORRECTION

(75) Inventors: Ramya Viswanathan, Wappingers Falls, NY (US); Amr Y. Abdo, Wappingers Falls, NY (US); Henning Haffner, Pawling, NY (US); Oseo Park, Hopewell Junction, NY (US); Michael E. Scaman, Goshen, NY (US)

(73) Assignees: International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 940 days.

(21) Appl. No.: 12/168,383

(22) Filed: Jul. 7, 2008

(65) Prior Publication Data
US 2010/0005440 A1 Jan. 7, 2010

(51) Int. Cl.
*G06F 17/50* (2006.01)
(52) U.S. Cl. .......................................................... 716/53
(58) Field of Classification Search ....................... 716/53
See application file for complete search history.

(56) References Cited

U.S. PATENT DOCUMENTS

| | | | |
|---|---|---|---|
| 6,077,310 A | 6/2000 | Yamamoto et al. | |
| 6,380,024 B1 | 4/2002 | Liaw | |
| 6,420,077 B1 | 7/2002 | Chen et al. | |
| 6,902,854 B2 | 6/2005 | Frankowsky | |
| 7,000,208 B2 * | 2/2006 | Zhang | 716/52 |
| 7,562,333 B2 * | 7/2009 | Parikh et al. | 716/53 |
| 2004/0250232 A1 * | 12/2004 | Kobozeva et al. | 716/19 |
| 2005/0149902 A1 * | 7/2005 | Shi et al. | 716/21 |
| 2006/0141366 A1 * | 6/2006 | Parikh et al. | 430/5 |
| 2007/0074146 A1 * | 3/2007 | Tanaka et al. | 716/21 |
| 2007/0100591 A1 * | 5/2007 | Harazaki | 703/2 |
| 2007/0157153 A1 * | 7/2007 | Croffie et al. | 716/21 |
| 2008/0178141 A1 * | 7/2008 | Sato | 716/19 |
| 2008/0195996 A1 * | 8/2008 | Torres Robles et al. | 716/21 |
| 2008/0276215 A1 * | 11/2008 | Higuchi et al. | 716/20 |
| 2009/0249261 A1 * | 10/2009 | Kim et al. | 716/2 |
| 2009/0300557 A1 * | 12/2009 | Parikh et al. | 716/4 |

OTHER PUBLICATIONS

Ban et al.; "OPC and Verification Accuracy Enchancement Using the 2D Wafer Image for the Low k1 Memory Devices"; Feb. 21, 2006; Samsung Electronics; pp. 1-8.*

* cited by examiner

*Primary Examiner* — Suresh Memula
(74) *Attorney, Agent, or Firm* — Yuanmin Cai

(57) ABSTRACT

A method of training an Optical Proximity Correction (OPC) model comprises symmetrizing a complex design to be a test pattern having orthogonal symmetry. Symmetrizing may comprise establishing a axis of symmetry passing through the design, thereby dividing the design into two portions; deleting one of the two portions; and mirror-imaging the other of the two portions about the axis of symmetry. The design may be centered.

9 Claims, 8 Drawing Sheets

CALIBRATION AND VERIFICATION STRUCTURES FOR USE IN OPTICAL PROXIMITY CORRECTION

FIELD OF THE INVENTION

The invention relates to optical proximity correction (OPC) of integrated circuit (IC) chip layouts, models built for such correction, and test patterns used to build the models.

BACKGROUND OF THE INVENTION

The invention relates generally to the design and fabrication of semiconductor devices, such as integrated circuit (IC) chips and, more particularly, to the steps involved in taking a "real chip design" and ensuring that the design is physically feasible, correcting the implementation based on process limitations, if necessary.

Computer-Aided Design (CAD)

Recently, various excellent CAD (Computer Aided Design) tools using computer technology have been developed. These CAD tools are now used to carry out almost all required operations in developing semiconductor integrated circuits, such as logic designing and layout designing.

FIG. 1A illustrates a "generic" Computer-Aided Design (CAD) system 100, comprising a calculating unit (computer, workstation) 102, a database 104 for storing a design library and/or design rules, an input device 106 such as a mouse or a tablet, a keyboard 108 for entering textual or numeric data, a display device 110 such as a computer monitor, a printout device 112 such as a printer, an output device 114 for storing designs and data on computer-readable medium such as flash drive or optical disc, and an interface 116 to a network 118 such as a local area network or the Internet for interacting with other users, interconnected as illustrated.

Some design elements of an integrated circuit (IC) are relatively more complex than others. A line, for example, is a relatively simple design element. A single transistor involves a combination of fundamental design elements. A static random access memory (SRAM) cell is an example of a yet more complex design. Examples of simple and complex designs are presented and discussed hereinbelow, with respect to FIGS. 1C-1F.

SRAM

Static random access memory (SRAM) is a type of semiconductor memory where the word "static" indicates that it, unlike "dynamic" RAM (DRAM), does not need to be periodically refreshed, as SRAM uses bistable latching circuitry to store each bit. However, SRAM is still volatile in the (conventional) sense that data is lost when powered down.

Random access means that locations in the memory can be written to or read from in any order, regardless of the memory location that was last accessed.

Each bit in an SRAM is stored on four transistors that form two cross-coupled inverters. This storage cell has two stable states which are used to denote 0 and 1. Two additional access transistors serve to control the access to a storage cell during read and write operations. A typical SRAM uses six MOS-FETs to store each memory bit.

FIG. 1B illustrates, schematically, a typical SRAM cell design, having 6 transistors, interconnected as shown. In order to implement the design, various physical elements need to be fabricated, such as field effect transistors (FETs) having gates, diffusion regions, contact structures, and the like, each of which is generally manufactured in a given one or more steps in a sequence of many steps.

U.S. Pat. No. 6,380,024, incorporated by reference herein, discloses a SRAM cell, similar to that of FIG. 1B, and also illustrates an exemplary physical implementation corresponding to a schematic design for the cell.

Photolithography

Photolithography (or optical lithography) is a process used in semiconductor fabrication to selectively remove parts of a thin film (or the bulk of a substrate). Generally, it uses light to transfer a geometric pattern from a photomask to a light-sensitive chemical (photoresist, or simply "resist") on the substrate. A series of chemical treatments then engraves the exposure pattern into the material underneath the photoresist. In a complex integrated circuit (for example, modern CMOS), a wafer may go through the photolithographic cycle up to 50 times, or more.

Photolithography resembles the conventional lithography used in printing, and shares some fundamental principles with photography. It is used because it affords control over the shape and size of the objects it creates, and because it can create patterns over an entire surface simultaneously. Its main disadvantages are that it requires a flat substrate to start with, it is not very effective at creating shapes that are not flat, and it can require extremely clean operating conditions. Also, at extremely small dimensions comparable to the wavelength of light itself, photolithography has some inherent limitations which need to be accommodated or compensated for.

As used herein, "photolithography" may include using electromagnetic radiation having wavelengths shorter than those of light, such as X-rays. A nanometer (nm) is one-billionth of a meter. The wavelengths of visible light, which is one form of electromagnetic radiation, ranges from approximately 700 nm (red light) to 400 nm (violet light). Ultraviolet radiation has a wavelength of approximately 100 nm. Modern semiconductor devices have features that are (for example) only 50 nm, which is already much smaller than the shortest visible light wavelength. X-rays have a wavelength of approximately 1 nm. Radio, television and microwave radiation has wavelengths that are longer than that of visible light, such as centimeters (cm) or meters, and are thus generally not of interest for photolithography. (However, radio frequency (RF) energy may be used, for example, in generating plasmas for etching semiconductor devices.)

Manufacturing semiconductor devices and elements having sizes smaller than one wavelength of light embraces a technology called "sub-resolution lithography". A key element of sub-resolution technology is using a technique Optical Proximity Correction (OPC).

Optical Proximity Correction (OPC)

As the level of integration in an integrated circuit (IC) continues to increase, dimensions of each circuit device are reduced correspondingly. Photolithography is an important step in the fabrication of semiconductors. Photolithography is involved in processes related to the fabrication of metal-oxide-semiconductor (MOS) devices such as the patterning thin films such as gate conductors (PC) and the marking out of active areas (RX) for implanting dopants. To attain higher level of integration, a few methods capable of increasing mask resolution has been suggested. One such method is optical proximity correction (OPC).

Generally, the idea behind optical proximity correction is the eliminate line offset due to proximity effect. Proximity effect refers to the phenomenon that occurs when a beam of light shines through an optical mask and projects onto a wafer. Due to diffraction of light beam on passing a material medium, the light beam will expand out somewhat. Furthermore, some of the light may pass through the photoresist layer into the wafer and then reflect back from the semiconductor substrate leading to interference. Hence, some portion of the photoresist may be double-exposed. The seriousness of such occurrences is intensified when the feature line width of an integrated circuit is small, especially when the wavelength of the light source approaches the width of a line pattern.

An integrated circuit (IC) chip typically begins its life as a design, referred to as a "real chip design". The various lines and shapes of circuit elements are designed on a computer, resulting in an overall pattern. Then, an optical mask may be made and used to transfer the computer-generated design to a layer of material, such as photoresist, on the wafer. The design is substantially replicated in the layer of material (photoresist). Then, a process such as etching may be performed to create patterns replicating the design in a layer of material (such as polysilicon, or oxide, or nitride) which is under the photoresist.

Optical proximity correction (OPC) is a technique used to modify real chip designs, so as to render them manufacturable. OPC is a photolithography enhancement technique commonly used to compensate for image errors due to diffraction or process effects. The two most common applications for OPC are linewidth differences between features in regions of different density (e.g., center vs. edge of an array, or nested vs. isolated lines), and line end shortening (e.g., gate overlap on field oxide). For the former case, scattering bars (sub-resolution lines placed adjacent to resolvable lines) or simple linewidth adjustments may be applied to the design. For the latter case, "dog-ear" (serif or hammerhead) features may be attached to the line end in the design. OPC has a cost impact on photomask fabrication, as the addition of OPC features means more spots for defects to manifest themselves. In addition, the data size of the photomask layout goes up exponentially.

The process of training an OPC model using test patterns is called calibration. Often arrays of structures that are simple to generate, such as pitches, line ends, inverse pitches, and inverse line ends are used for calibration. These are representative of many aspects of the chip design, but many of these simple patterns do not capture the complexity of some of designs, for example SRAMS, which are usually two-dimensional (2D), and sub-ground rule patterns.

Consider, for example, a case where it is desired to form a circuit element comprising two parallel lines, each having a specified thickness, with a gap having a certain distance between them. A design of the circuit element may be made, such as on a CAD system, and represents the desired physical implementation (realization of the design, "in silicon"). A lithography mask having an image of the two lines is made, to manufacture the design. The mask image is the same as the design (although it may be magnified, depending on the equipment being used). At extremely small scales, due to optical effects, particularly proximity effects, in the physical implementation of the design, the lines or the gap may become distorted. For example, the gap between the two lines may become larger. This is generally not acceptable.

It is therefore known to modify the mask image, in a controlled manner, so that the resulting physical implementation of the circuit element more accurately represents the original design. For example, box shapes may be added, as extensions to the ends of the two lines, in the mask image, so that the resulting physical realization of the design more accurately represents the intent of the design—namely, two parallel lines, each having a specified length and thickness, with a gap having a certain distance between them. In other words, "what you see" is not "what you get", and the distortions which occur may advantageously be exploited (incorporated into the modified mask image) so that "what you get" is "what you want". Generally, there are two ways to implement the desired modifications to the mask image, or "optical proximity correction (OPC), "rule-based" and "model-based".

In "rule-based" OPC, the approach is to implement a set of design rules, or "formulas", such as "if this is the condition, then make such correction". In the aforementioned example of two lines, "if two lines are spaced distance apart, then modify the design to have box shaped extensions at the ends of the lines".

In "model-based" OPC, a plurality of basic structures are designed, modeled and implemented. In contrast with "rule-based", "model-based" is more empirical, based on creating and implementing (printing on a wafer) a number of designs, and measuring the results. Using these results, the software is "taught" how to make correlations. By providing a few examples, correlations can be made between the original design and the manufactured wafer (physical implementation). Then, for a new design, a simulation may be performed, to see what happens. The system iteratively goes through this process until a satisfactory result is obtained.

Simple 1- and 2-Dimensional Test Patterns

FIGS. 1C-1F are examples of what may be referred to as "simple" patterns. Simple patterns usually consist of line/space type of structures. Simple patterns are normally used to calibrate an OPC model. Simple patterns are easy to generate, and fairly simple to measure.

For example, in FIG. 1C there is a space "S1" between adjacent (side-by-side) line segments, and that can be considered to be one dimension. If the width "W1" of the line is also included, that can be considered to be a second dimension.

For example, in FIG. 1D there are two areas, separated from one another, each area having two side-by-side line segments. This is generally a one-dimensional pattern.

For example, in FIG. 1E, there are two line segments, end-to-end, with a space "S2" between their tips. Each line segment may also have a length and a width, of interest, making it a "two-dimensional" pattern.

For example, in FIG. 1F, there are a number of pairs of lines segments which are oriented end-to-end, with a space between them. And, one pair of line segments is adjacent (side-by-side) another pair of line segments. This is a 2-dimensional pattern.

FIG. 1C also exhibits what is referred to as "reflectional" symmetry. An image is said to have reflectional symmetry if there is at least one line which splits the image in half so that one side is the mirror image of the other. Reflectional symmetry is also called line symmetry or mirror symmetry because there is a line in the figure where a mirror could be placed, and the figure would look the same. In the examples of FIGS. 1C-1F, each pattern has reflectional symmetry in two orthogonal axes, having what is referred to herein as "orthogonal symmetry".

For example, in FIG. 1C, the design is symmetrical to the left and right of a vertical dashed line. Also, the design is symmetrical to the top and bottom of a horizontal dashed line. This design has at least two axes (lines) of symmetry. (A design may also be symmetrical about diagonal lines. It is possible to have many lines of reflectional symmetry). Dashed lines representing two axes (horizontal and vertical lines) of symmetry are also shown in FIGS. 1D, 1E and 1F.

Some Exemplary Patent References

U.S. Pat. No. 6,902,854, incorporated by reference herein, discloses method for carrying out a rule-based optical proximity correction with simultaneous scatter bar insertion. Lithographic fabrication of a microelectronic component is performed with the aid of OPC and a scatter bar structure. At least one scatter bar is applied on a mask in addition to a main structure for the purpose of a subsequent imaging of the main structure from the mask onto a substrate by exposure. At least one correction value for the OPC is selected in a particular manner in dependence upon a spacing between two parts of the main structure or spacing between neighboring main structures and the presence of a scatter bar between the two parts of the main structure. The manner in which the correction value is defined is determined by so forming an auxiliary quantity for each scatter bar, that the largest auxiliary quantity that is set is less than the smallest spacing between the parts of the main structure, so that in a program for OPC the presence of a scatter bar between the two parts of the main structure is suggested. In this way, correction values for a rule-based OPC method are flexibly defined even in the presence of scatter bars.

U.S. Pat. No. 6,077,310, incorporated by reference herein, discloses an optical proximity correction system. Pattern data that is an object of correction is divided into an area on which correction is made using correction values that have been obtained in advance for patterns and their respective layouts and an area on which correction is made on the basis of correction values calculated by a simulator. For example, simulation-based correction is made on a gate layer in a memory, while rule-based correction is made on a gate layer in the other area than the memory on the basis of rules for active gate width only. After being subjected to the correction, the areas are combined.

U.S. Pat. No. 6,420,077, incorporated by reference herein, discloses a contact hole model-based optical proximity correction method. The method includes building a contact hole model from the database obtained through a series of test patterns each having a plurality of contact holes of different line widths but identical distance of separation. Line width offsets due to proximity effect are eliminated by referring to the contact hole model.

FIG. 1G is a is a sketch showing the test patterns used by a conventional contact hole model-based optical proximity correction method, such as disclosed in the U.S. Pat. No. 6,420,077 patent.

As shown in FIG. 1G, a square contact hole 102 in test pattern 100 has a line width 104. Distance of separation or pitch from one contact hole 102 to its neighboring contact hole is labeled 106. For example, line width 104 of the square contact hole 102 in test pattern 100 is 0.8 µm and distance of separation between neighboring contact holes is 1.6 µm. Similarly, line width of contact hole 112 in test pattern 110 is 0.84 µm and distance of separation between neighboring contact holes 112 is 1.68 µm. Finally, line width of contact hole 116 in test pattern 114 is 0.88 µm and distance of separation between neighboring contact holes 116 is 1.76 µm.

Using a photomask having the test patterns 100, 110 and 114 thereon, a layer of photoresist is exposed and then developed. Thereafter, line widths of various patterns on the developed photoresist layer are measured. Because of proximity effect, contact hole patterns on the wafer are slightly different from the original test patterns on the photomask. Most probably, the corners of the square holes may be rounded and line width may be smaller. After measuring the actual line widths, a line width versus distance of separation graph may be plotted for both the predicted and the actual values.

Using optical proximity correction based on the model, proper optical mask line widths can supposedly be selected to form the desired line width on the photoresist layer during a contact hole forming process. In practice, the established model can hardly produce the kind of accuracy demanded. This is because proximity effect may vary according to distance of separation, thereby changing the effect on line width.

In other words, when the distance of separation is greater than a few times the line width, proximity effect has little influence on line width dimensions. However, as distance of separation is not much different from the line width, proximity effect can affect the ultimate line width dimensions of the contact holes considerably. Hence, a simple distance of separation versus line width relationship can hardly produce the kind of prediction needed for forming contact holes having correct dimensions and position.

Test patterns such as shown in FIG. 1G having contact holes of different line widths but identical distance of separation between neighboring holes may be generated. The ratio between line width and distance of separation between neighboring lines, called "pitch ratio", is an important design parameter. For example, one test pattern may have a pitch ratio of 0.8:0.8, that is, 1:1. Another test pattern may have a pitch ratio of 0.4:0.8, that is, 1:2. Yet another test pattern may have a pitch ratio of 0.2:0.8, that is, 1:4. In other words, a variety or test patterns may be created, such as in one overall test array using different pitch ratios of the contact holes. Using a photomask having the aforementioned test patterns thereon, the test patterns are transferred to a photoresist layer and then developed. Line widths on the developed photoresist layer are measured. Due to proximity effect, the contact hole patterns on the silicon chip will differ slightly from the original patterns on the photomask. The corners may be rounded and line width may be reduced. By comparing the measured line widths with the original line widths on the photomask, a contact hole model for optical proximity correction is obtained.

GLOSSARY

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

IC short for integrated circuit. In electronics, an IC (also referred to as microcircuit, microchip, silicon chip, or chip) is a miniaturized electronic circuit consisting mainly of semiconductor devices, as well as passive components, that has been manufactured in or on the surface of a thin substrate of semiconductor material. Among the most advanced integrated circuits are the microprocessors or "cores", which control everything from computers to cellular phones to digital microwave ovens. Digital memory chips and ASICs (application specific ICs) are examples of other families of integrated circuits that are important to the modem information society. While cost of designing and developing a complex integrated circuit is quite high, when spread across typically millions of production units the individual IC cost is minimized. The performance of ICs is high because the small size allows short traces which in turn allows low power logic (such as CMOS) to be used at fast switching speeds.

lithography In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

mask The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask".

MEEF short for mask error enhancement factor. MEEF is a measure of how much an error on a mask is going to be magnified on a wafer.

resist short for photoresist, also abbreviated "PR". Photoresist is often used as a masking material in photolithographic processes to reproduce either a positive or a negative image on a structure, prior to etching (removal of material which is not masked). PR is usually washed off after having served its purpose as a masking material.

SRAM short for static random access memory. SRAM is a type of semiconductor memory. The word "static" indicates that the memory retains its contents as long as power remains applied, unlike dynamic RAM (DRAM) that needs to be periodically refreshed. A typical SRAM cell may comprise six transistors (FETs).

wafer In microelectronics, a wafer is a thin slice of semiconductor material, such as a silicon crystal, upon which microcircuits may be constructed.

Some other abbreviations which may be used herein, or in related documentation may include:

CA which is used to indicate a contact
M1/MX which is used to indicate metal level. M1 being a first metal, MX being another level.
NOOPC which is used to indicate that no OPC is being performed.
PC which is used to indicate a gate (G)
RX which is used to indicate active area

SUMMARY OF THE INVENTION

The present invention is generally directed to model or simulation based OPC, and a technique to create more efficient models by providing a technique to create complex test patterns on which an OPC model can be trained.

According to an embodiment of the invention, a model-based optical proximity correction (OPC) method comprises: clipping a plurality of pieces from a complex design; symmetrizing the clipped pieces; and using a plurality of symmetrized pieces to create a library of different designs. The clipped pieces may be used to calibrate the OPC model.

According to an embodiment of the invention, a model-based optical proximity correction method comprises the steps of: creating a library of symmetrized test patterns; printing the symmetrized test patterns on a wafer; comparing the resulting printed test patterns on the wafer with the symmetrized test patterns; and teaching an OPC model to select an appropriate test pattern from a library of symmetrized test patterns so that the test patterns can be reproduced when printed on a wafer.

According to an embodiment of the invention, a method of training an Optical Proximity Correction (OPC) model comprises: symmetrizing a complex design to be a test pattern having orthogonal symmetry. Symmetrizing may comprise establishing a axis of symmetry passing through the design, thereby dividing the design into two portions; deleting one of the two portions; and mirror-imaging the other of the two portions about the axis of symmetry. The design may be centered.

BRIEF DESCRIPTION OF THE DRAWINGS

In the drawings accompanying the description that follows, both reference numerals and legends (labels, text descriptions) may be used to identify elements. If legends are provided, they are intended merely as an aid to the reader, and should not in any way be interpreted as limiting.

DETAILED DESCRIPTION OF THE INVENTION

Figure 1A:
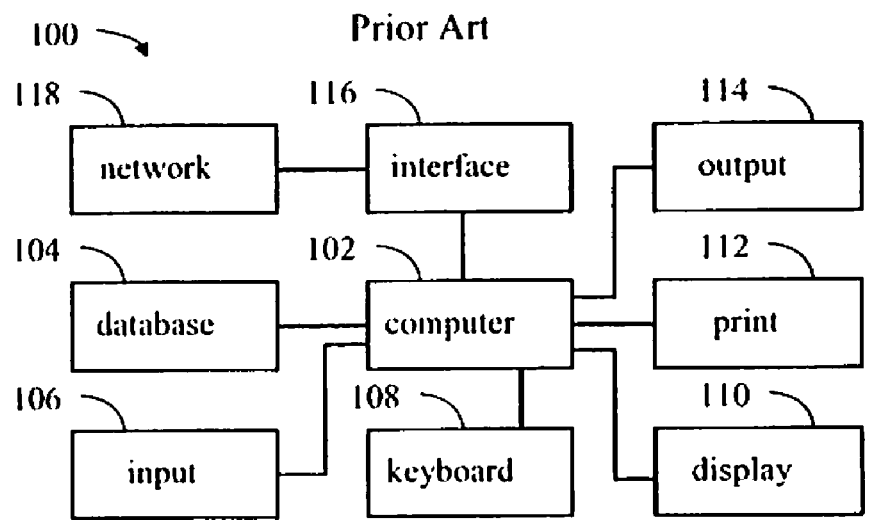
FIG. 1A is diagram of a computer-aided design (CAD) system, according to the prior art.
Figure 1B:
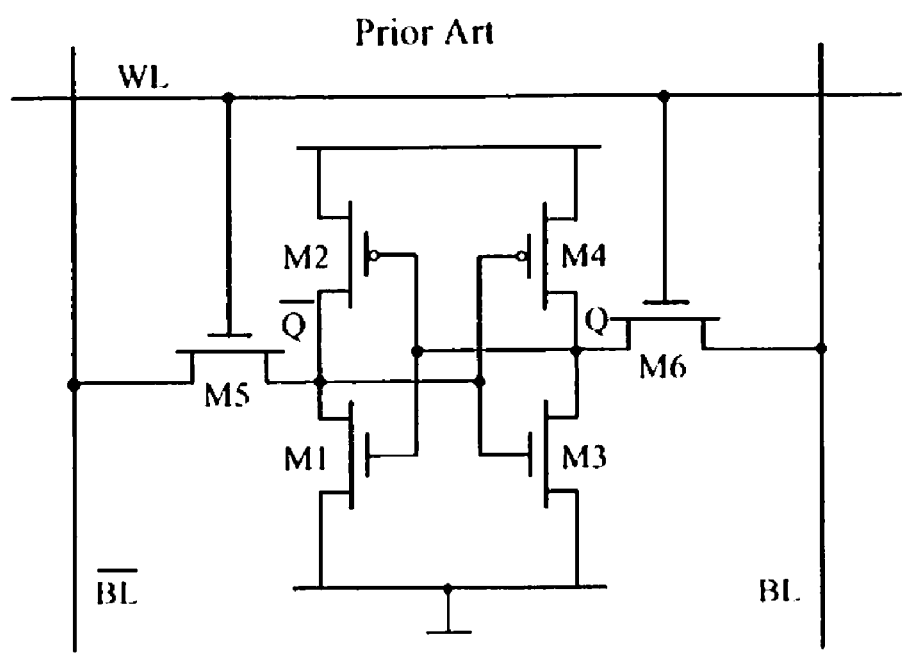
FIG. 1B is a schematic illustration of a static random access memory (SRAM) cell, according to the prior art.

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, and sometimes their relative sizes that is of significance.

Proximity correction provides a key to sub-resolution lithography manufacturing. Optical proximity correction (OPC) models are generally required for advanced integrated circuit (IC) manufacturing. Real IC layout designs that are the foundation of high performance technologies are generally difficult to model for purposes of OPC due to their complex and often asymmetric nature.

OPC can be either a rules-based or model-based approach. In the rules-based approach, the designs are modified according to a pre-determined set of rules, often called a rule table. This approach is usually adequate when the designs are simple. However, as the designs become more complex, the rule tables required to correct these designs becomes unwieldy and difficult to generate. In these situations, model-based OPC provides a better approach. The model-based method involves building a model, using a set of patterns called "test patterns" that are representative of the real chip design. The models, which are "trained" on these patterns, are then used to correct any real chip designs for manufacturing. The advantage of the model-based approach over a rules-based method is that the number of test patterns required to build a model may be much smaller than the number of rules in a rule table for a complex chip design. In addition, a well trained model will have the ability to apply the appropriate corrections for new layouts that it has not encountered before.

Model based OPC consists of two main steps;
1. Build or train a model.
2. Use this model to correct layouts so that they are more manufacturable—this is what is called "model based OPC"

Model based OPC has been used to correct all types of layouts both simple and complex. However, in the past, OPC models have been built or trained with simple designs. The inefficiency in the ability of these models to correct complex layouts is a problem being addressed herein. The techniques presented herein provide a way to easily create "complex" designs that are representative of the real layout that can be used to build an OPC model.

Often, arrays of structures that are simple to generate are used in OPC model build (calibration) such as pitches, line ends, inverse pitches, and inverse line ends. These are representative of many aspects of the chip design, but many of these simple patterns do not capture the complexity of the SRAMS which are usually two-dimensional (2D), and sub-ground rule patterns. In addition, in the cases of active layer (RX) and metal (M1/MX) patterns, SRAM designs are probably too complex to generate using simple shape routines that would result in patterns representative enough for an empirical model for OPC use. On the other hand, there may be significant non-linearities in the tightest pitches of SRAMs not captured in models made with simplistic shape structures. This all leaves a potential exposure for modeling for SRAMs and also for other demanding features which might include DRAMs or other difficult two dimensional structures.

Every technology generation is defined by the smallest feature size that can be printed on the chip. For all feature types, this collection of rules is called the "ground rules". Sub ground rule patterns are those that are smaller than these ground rules. Static Random Access Memory (SRAMs) are large arrays of memory layouts that take up a lot of space on the chip, so they are designed sub ground rule to get maximum density which translates into smaller chip size.

Model-based OPC is critical, but the calibration of two-dimensional (2D) structures has been problematic, given the mostly one-dimensional (1D) calibration structures in most model based OPC calibrations. Additionally for some levels like M1/MX and RX it may not even be practical or manageable to make simple routines that approximate the actual shapes. However, with empirical calibrations, it would be desirable to have the shapes used for calibration to be as similar as possible to the actual shapes of the target layouts, the SRAM being a prime example of an important and difficult shape to calibrate for.

It should be understood that SRAM is being used as an example of a complex shape to be modeled for calibration (training) of a model-based OPC, but the invention is not limited to SRAM designs.

In response to the aforementioned problems, techniques are disclosed herein which allow for the creation of a complex collection of 2D SRAM structures useful for SEM calibration for model-based OPC; convention calibration for model based OPC, verification and also for calibrations for simulation based approaches. Typically, these are a plurality of different SRAM structures, larger ones being optimized for power performance, smaller ones for density.

The following abbreviations and terminology may be used herein:
PC—poly conductor
RX—acronym for active area
M1—metal 1 level
CA—contact level
DT—deep trench
MEEF—mask enhancement error factor. (How much an error in the mask shape is magnified when printed on wafer)
dual gate SRAM—one type of SRAM which has 2 poly conductors.

RX, PC, M1, CA are called "critical levels" as they have the smallest dimensions allowed in the technology generation. They are therefore the most difficult to manufacture. SRAMs are examples of high MEEF designs. This means that they are very sensitive to small errors in mask. So, if the pattern on the mask is 1 nm smaller than the design layout, due to the errors in the mask manufacture, the pattern on wafer would be 4 nm smaller than design is the MEEF is 4. The MEEF is dependent on the type of manufacturing system being used. But for a given manufacturing system, the MEEF is design dependent, some designs are not very sensitive to high MEEF while others are. The ability to use an actual SRAM layout allows us to train the model using high MEEF patterns (of which SRAMs are an example, there are other layouts as well). This is very important since the model now understands how to recognize and correct a high MEEF layout when it sees one. The disclosure provides a method to create calibration arrays of structures, including these high MEEF patterns.

The model is trained or calibrated using a set of patterns. Then it is tested or verified against a new set of patterns. For the verification step, the patterns are identified and measured on wafer. The model is then used to simulate the wafer measurements, to see how well the model was able to predict the wafer results. The better the model prediction and wafer measurements agree, the better the model quality is.

There are generally two aspects to the techniques disclosed herein:

(1) Method to synthesize structures for dual gate SRAMs (for example) calibration and verification (which is mainly about PC and DT); and (2) Methodology to integrate high MEEF structures into OPC model calibration consideration (this is mainly about PC RX M1/MX and applicable to CA as well).

In the first case (1) SRAM structures (for example) may be generated using a software routine. In the second case (2) different symmetrized SRAMs pieces may be imported from a library. In either case (1 or 2) they may be scaled up or down from the original, for example 45 nm, to generate a calibration set for 65 nm or 32 nm as another use case.

In summary this approach allows for the creation of a complex collection of 2D SRAM structures useful for SEM calibration for model-based OPC, conventional calibration for model based OPC, verification and also for calibrations for simulation based approaches.

Figure 1C:
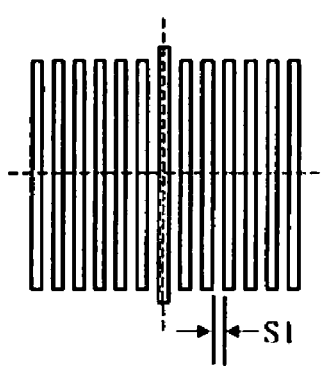
FIGS. 1C-1F are diagrams of illustrative simple designs, according to the prior art.
Figure 1D:
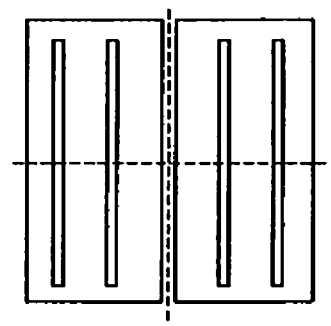
Figure 1E:
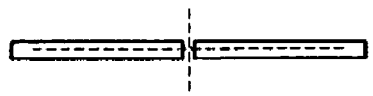
Figure 1F:
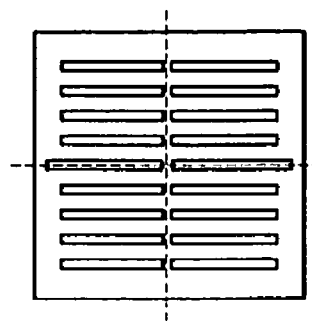
Figure 1G:
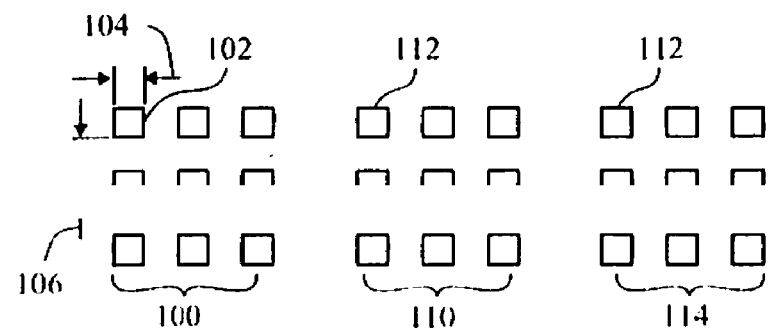
FIG. 1G is a sketch showing the test patterns used by a conventional contact hole model-based optical proximity correction method, according to the prior art.

Conventional calibration consists of measuring one dimension on wafer, for example the width of a line at one location, or the width of a space at one location, and using that information to train the model. (Refer, for example, to the space S1 in FIG. 1C) SEM calibration refers to a method where the entire shape of a structure is measured, including for example the outline, and is used to train the model.

Figure 2:
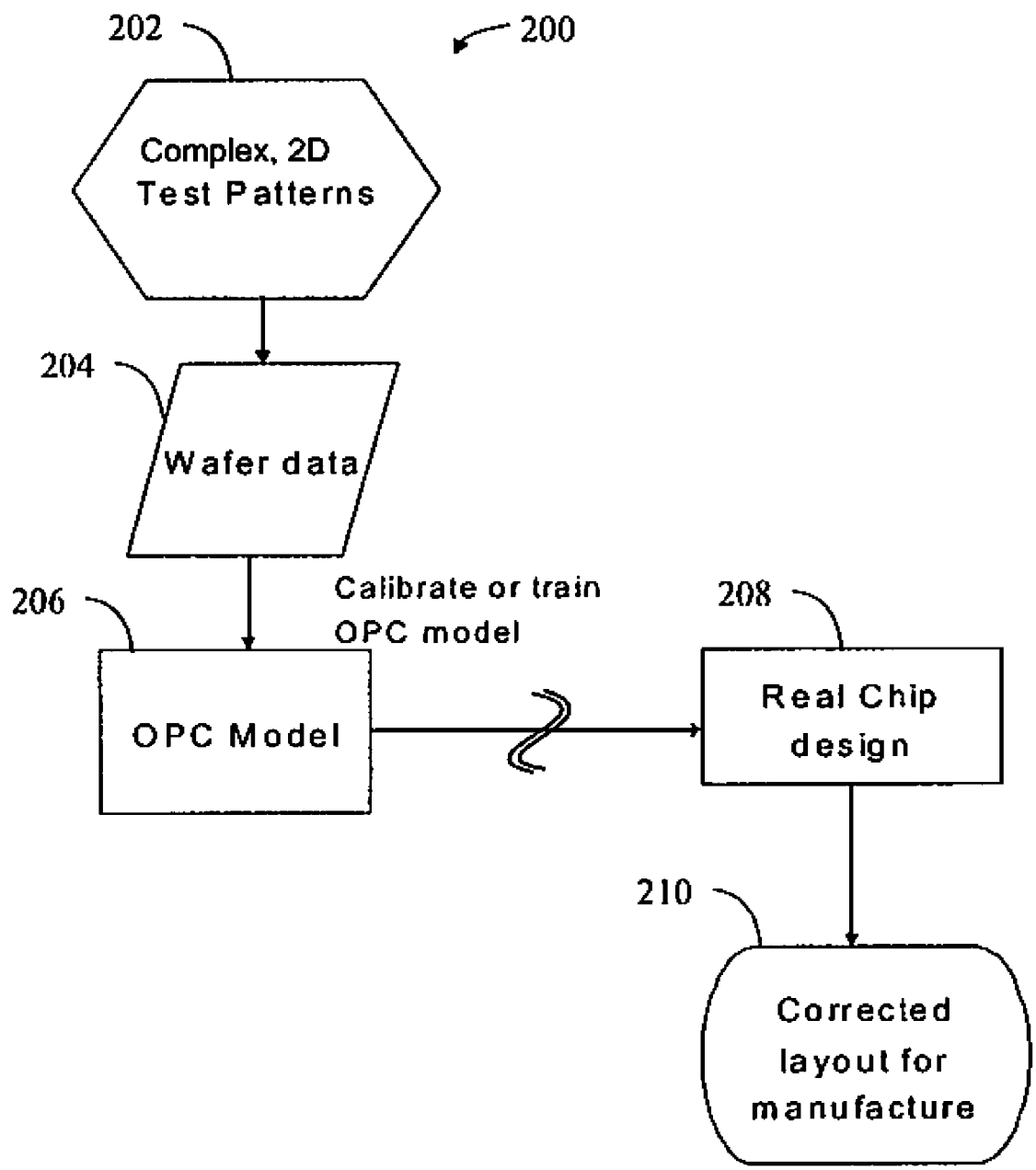
FIG. 2 is a diagram illustrating a model-based OPC flow, according to the invention.

FIG. 2 illustrates an overall, model-based OPC flow 200, according to the invention. In a step 202, a plurality of complex, 2D test patterns are provided. These test patterns are representative of real chip designs. The test patterns are sent to the factory to be printed on a wafer. In a step 204, measurements are made (wafer data is obtained) from the test patterns. The original (real chip) design is compared with the measurements and, in a step 206, the results of the comparison are used to calibrate, or "train" the OPC model. This is the "learning" part of the flow 200, where the OPC model is taught what mask images result in what results when printed, and can make correlations.

In a manufacturing part of the flow 200, in a step 208 the OPC model (206) is used, in conjunction with a real chip design, to generate a corrected design layout 210 for manufacture. As mentioned above, the corrected design layout may be a modified version of the original design, so that "what you want" is "what you get".

According to an aspect of the invention, test patterns (202) may be generated (in software) or they may be extracted ("clipped") from real designs. These patterns may be simulated (in software), or printed on a wafer and measured. The results of the simulation and/or printing/measurement, provides input for the OPC model.

Because of the way that simulation is currently being performed, the patterns should be symmetric, having reflection symmetry in both the horizontal and vertical directions. (Current simulation techniques may assume that left and right of a center point are the same, or symmetric.)

Usually symmetric calibration patterns are important for both the measurement of the parts and the modeling of the corrections needed. The process of proximity corrections, modeling and measurements on actual parts work together. OPC calibration software generally makes a simplifying assumption that the proximity error is equal on both sides. This drives a special need for symmetry left and right. The measurement tools need to measure at the point of interest, not above or below, and being symmetric top and bottom so that a maximum or minimum measurement in a bulged feature is not above or below the point of interest. Verification patterns to test the combination of calibration and proximity correction generally may and should include asymmetric patterns.

It should be understood that simulation methods used by software generally require symmetry, which is why it is beneficial to first symmetrize the designs. (Note the distinction between the simulation method and the software.) If the simulation methods were not symmetry limited, then the test patterns could be SRAM clips from real chip layout without having to first symmetrize them. The techniques disclosed herein are primarily directed to the use of these types of structures to train a model and then to a way to make them symmetric.

Figure 3:
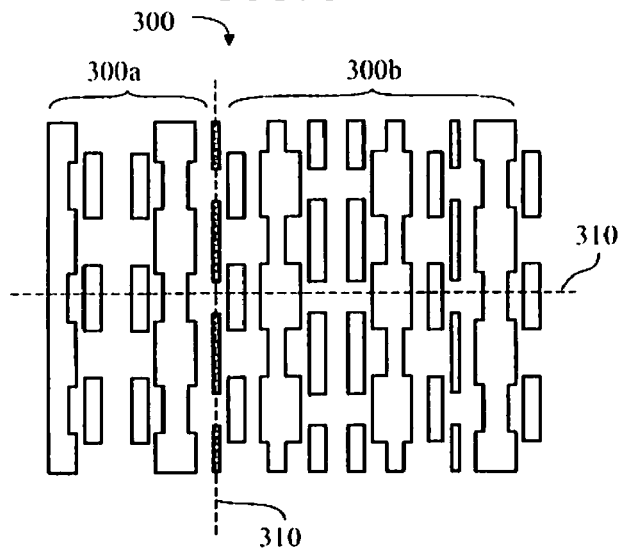
FIG. 3 is a diagram of a complex design.

FIG. 3 is an example of what may be referred to as a "complex" pattern 300. This is, for example, SRAM poly. This may be a clip from an actual layout. Note that although there is reflectional symmetry to the top and bottom of a horizontal dashed line 310, there is no vertical line about which there will be symmetry. Therefore, having only one axis of symmetry, the pattern does not have "orthogonal symmetry".

According to the invention, a complex design is modified to have two orthogonal axes of reflectional symmetry—to have "orthogonal symmetry". The complex design may originate with only one axis of symmetry, or it may have none. The modification of the design to have orthogonal symmetry may be performed, as follows.

First, find a place in the pattern 300 where a vertical line can either pass between elements or, if it passes through an element, that element will itself have mirror symmetry.

For example, the dashed line (one axis of symmetry) 312 is established, passing vertically through the design 300, through four end-to-end line segments which are generally collinear with each other, and each of which (in and of itself) has left-right symmetry. Alternatively, the axis of symmetry could pass between elements of the design.

The line 312 divides the pattern (design) into two portions, a left portion 300a and a right portion 300b. The left portion 300a is not a mirror image of the right portion 300b. Thus, the pattern 300 lacks left-right reflectional symmetry (although it has up-down reflectional symmetry).

The software used in the OPC model generally requires that there be orthogonal symmetry. Since the pattern 300 is lacking in orthogonal symmetry, it is modified to have orthogonal symmetry, as follows.

Figure 3A:
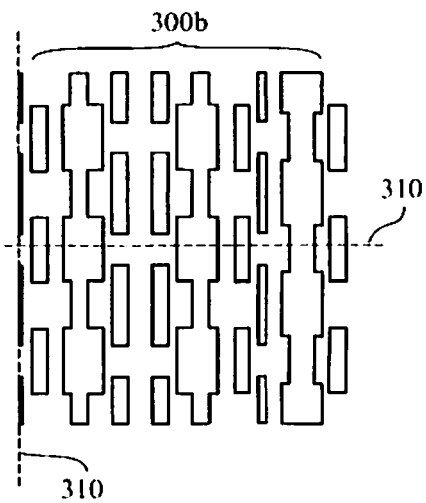
FIGS. 3A and 3B are diagrams illustrating symmetrizing the design of FIG. 3, according to the invention.

Starting with the pattern 300, everything to the left of the vertical line 312 is eliminated. The left half 300a of the pattern 300 is removed (deleted). Half of the line segments, through which the line 312 passes, are removed. The resulting interim pattern is shown in FIG. 3A.

Figure 3B:
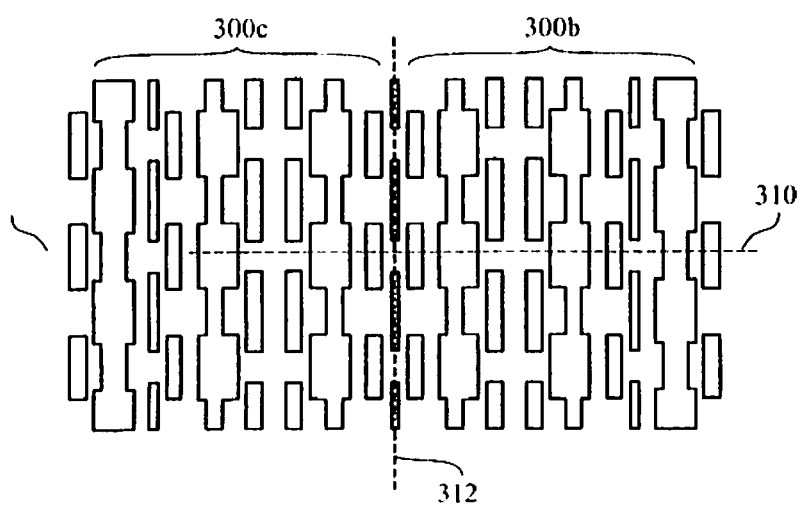

Next, everything to the right of the vertical line is replicated (mirrored, or mirror-imaged), about the vertical line. This is shown in FIG. 3B. The result is a complex 2-dimensional pattern having orthogonal symmetry which can be used in an OPC model.

A similar process of eliminating a portion of the pattern and replicating the remainder of the pattern could be done to achieve reflectional symmetry about a horizontal axis, if this were lacking, but recall that the design of FIG. 3 started reflectional symmetry about the axis 310.

Complex patterns are more difficult to create, but are generally more representative of real layouts.

Once a design is symmetrized (modified to have orthogonal symmetry), it can be modified in size and orientation to provide a plurality of different test patterns for the OPC model.

Figure 4:
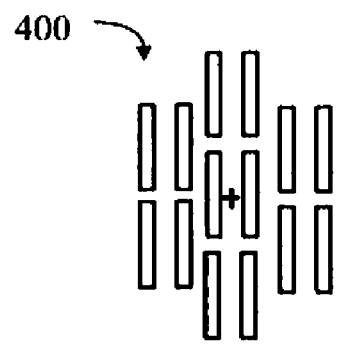
FIG. 4 is a sketch showing a test patterns to represent a SRAM design, for the model-based OPC technique of the present invention.

FIG. 4 illustrates a pattern 400 for gate level (PC) for SRAMs. The pattern has two sets of three vertically spaced-apart line segments, two sets of two vertically spaced-apart line segment to the left of the three vertically spaced-apart line segments, and two sets of two vertically spaced-apart line segments to the right of the three vertically spaced-apart line segments.

This pattern 400 is already or has already been symmetrized to have orthogonal symmetry. Note, for example, that there is symmetry about a horizontal axis (not shown) passing through a central point "+", and that there is symmetry about a vertical axis (not shown) passing through the central point. This co-ordinate "+" is used to center the layout within the array. (It does not exist on the mask or wafer.)

In an actual circuit, there may be many different SRAMs. It is therefore desirable to have many different SRAM test patterns which are symmetrized for the OPC model, for model calibration.

Variations may be made of SRAM patterns, such as by rotating the design, and changing the length of the bars in each line. These can be generated by software.

Figure 4A:
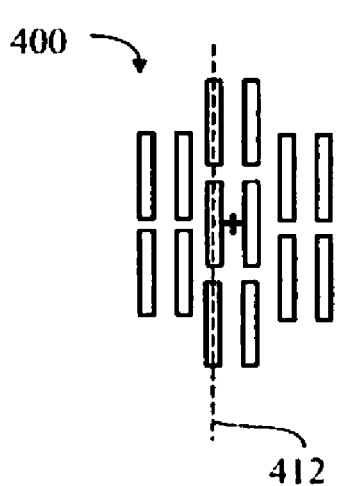
FIGS. 4A and 4B are diagrams showing how the test pattern of FIG. 4 may be altered, according to the invention.

In FIG. 4A, for example, a vertical line 412 is passed through the left or two sets of three vertically spaced-apart line segments in the pattern 400. Then, everything to the left of the line 412 is deleted, and everything to the right of the line is duplicated (mirrored). This results in a variation 402 of the pattern 400 of FIG. 4, but with three sets of vertically spaced-apart line segments in the middle. See FIG. 4B. Note the center mark "+".

Figure 4B:
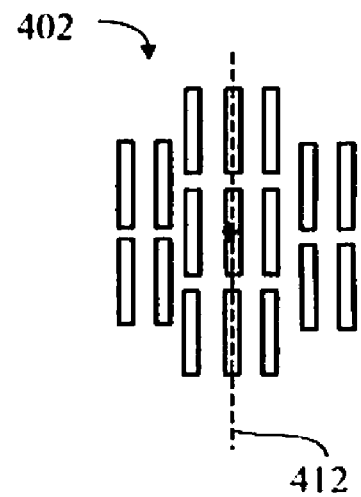
Figure 4C:
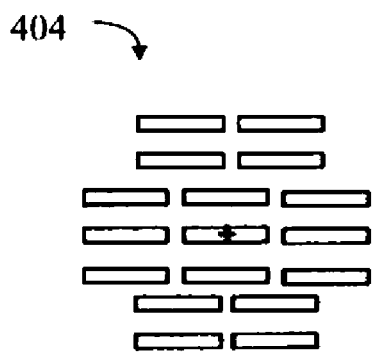
FIG. 4C is a diagram showing how the test pattern of FIG. 4B may be rotated, according to the invention.

In FIG. 4C, for example, the pattern 402 of FIG. 4B is rotated 90 degrees, and one of the two line segments in each of the two outside sets of line segments are eliminated. The resulting pattern 404 is shown. Note the center mark "+".

Figure 4D:
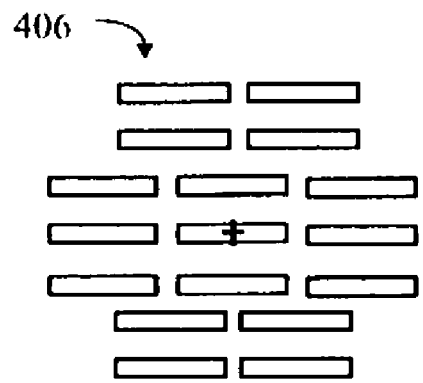
FIG. 4D is a diagram showing how the test pattern of FIG. 4C may be scaled, according to the invention.

In FIG. 4D, for example, the pattern 404 of FIG. 4C is enlarged. The resulting pattern 406 is exemplary of "scaling", which may be either enlarging or reducing. Note the center mark "+".

In the real design for active or metal, the designs are complex, and need "clipping". The clipping process involves centering and symmetrizing.

The invention is generally directed to the way in which the OPC software is taught how to make images of designs that will result in the physical implementation of the design most-nearly resembling the intended design, using the model-based approach. Generally, a few designs (or patterns, or shapes) may be chosen, and are selected as being representative of most of the designs that may be used. Selected shapes are run through the model.

In the past, it has been known to use simple shapes, such as lines and spaces. These simple shapes are essentially "one-dimensional" (1D). A drawback of this approach is that a real design, such as for an SRAM cell, can be more complex, and are essentially "two-dimensional" (2D), as well as complex. The invention is directed to modeling, using the 2D-complex approach.

There may be some restrictions on what models can be used. Generally, symmetric models should be used, since they are much easier to execute and analyze, given current computing limitations. The simulation may be performed assuming that there is symmetry in at least one dimension, such as left-right (mirror) symmetry.

FIGS. 4-4D illustrate test patterns based on different SRAMs in each cell. What is being illustrated here is that PC layouts do come in different orientations, and that this method can create test patterns for both cases.

For complex shapes, such as the active area (RX) and metal interconnect (M1 . . . Mx) for SRAMs, a library of symmetrized pieces may be made for each key SRAMs, and this library may be used to create test patterns for the empirical model calibration.

For each key SRAM, a small clip may be taken and marked with a plurality of marker shapes for verification purpose. These shapes may be converted to a form which can be imported into an array of structures for use on a calibration and verification test mask. (A "key" SRAM is one that is important to the technology generation, amongst many that are being tested.

In addition to opening up a more direct calibration of the SRAM features from complex 2D shapes, a scaling may be applied, and calibration and verification sets may be generated for other technologies which themselves may have ground-rules scaled from the current set, where limited amounts of such technology SRAMs or other layouts might be available yet due to the early nature and becomes an avenue for generating SRAM structures for new smaller technologies directly scaling the old structures for a given level.

For simple shaped SRAMs, such as in PC and DT, a synthesized approach may be used to generate a structure similar to the actual SRAMs (specifically, such as the dual gate structure).

For example, by selecting a rectangular pattern such as that shown in FIG. 3 based on pitch in x and y and rectangular width in x and y. Taking the column module 4 and shifting the 1, 2 differently than 3, 4, a pattern may be obtained which approximates a dual gate PC structure. A rotation of either 0 degrees or 90 degrees may be performed, as well as an option to triple the center.

In FIG. 4B, the center row of line segments was tripled to generate structures suitable for calibration by empirical model for OPC purposes, and could also be used for verification or also for litho experiment purposes. Such structures may go on a test mask and may be used to model demanding SRAMS and would represents the actual SRAM structures closer than a simpler ID pitch structure or a typical line end structure would.

Figure 7:
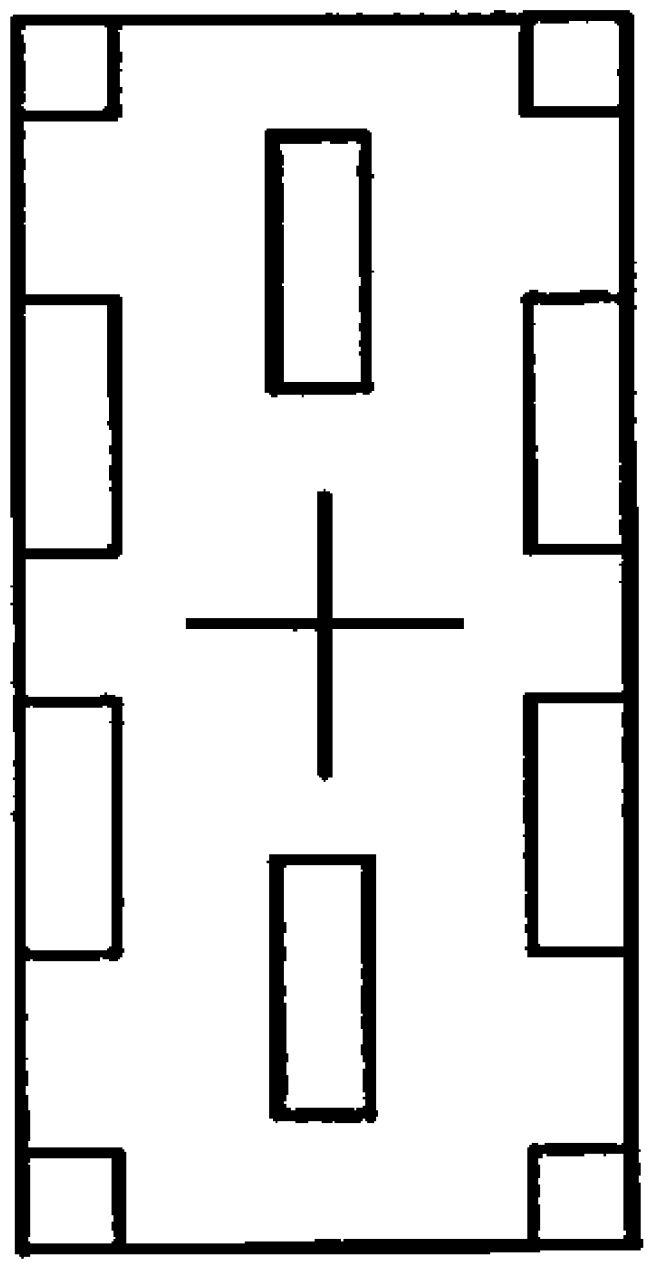
FIG. 7 is a sketch illustrating a centering flow, and how an SRAM layout can be taken and converted into a calibration pattern, according to the invention.

In this synthesized approach, computer scripts which can generate and approximate the SRAM's structure, adding rotation and the center appropriately as shown in the FIG. 7 can be written to assure the symmetry which is a requirement for some empirical model-based OPC generators.

Additionally some features such as the tip-to-tip may be varied for each SRAM to allow for experimentation and optimization. These structures are synthesized, they are not imported.

A collection of calibration cells may be organized into a macro for PC SRAM calibration and for lithography experiments, one implementation for the SEM calibration verification scaled from 65% to 1.15% where 100% represents a 45 nm process. These structures are imported from actual PC SRAMs and may be used for verification of the calibration using the synthesized structures.

Additionally, although such complex calibration targets might be more difficult to measure using conventional SEM approach, the calibration data may be supplemented with a simulated curvature using the "best predictive" model, and in this way the curvature prediction may be used to select the right SEM routine whether it be maximum, minimum, or linear based on bending in, bending out, or being approximately linear.

Also, by having special structures for SRAM, a model may be built giving more weight to the SRAMs, and another model may be built given less weight to the SRAMs. The OPC may be modified to use the more heavily SRAM-weighted model for SRAMS and other related sub-ground rule structures, and use the other less weighted structure for other structures. This may capture any non-linearities going on in the sub groundrule area while not compromising the other areas, given that empirical model forms may not be able to capture all non-linearities perfectly and might be better done in a piecewise case-by-case approach like this.

According to an aspect of the invention, real device layouts, such as SRAM, can be "clipped", then made symmetric, without losing the uniqueness of the design. This can be done in a few different ways. With reference to FIG. 3, for example, test for PC SRAM is performed. This same procedure could be used, for example, for deep trench (DT) layouts.

Figure 5:
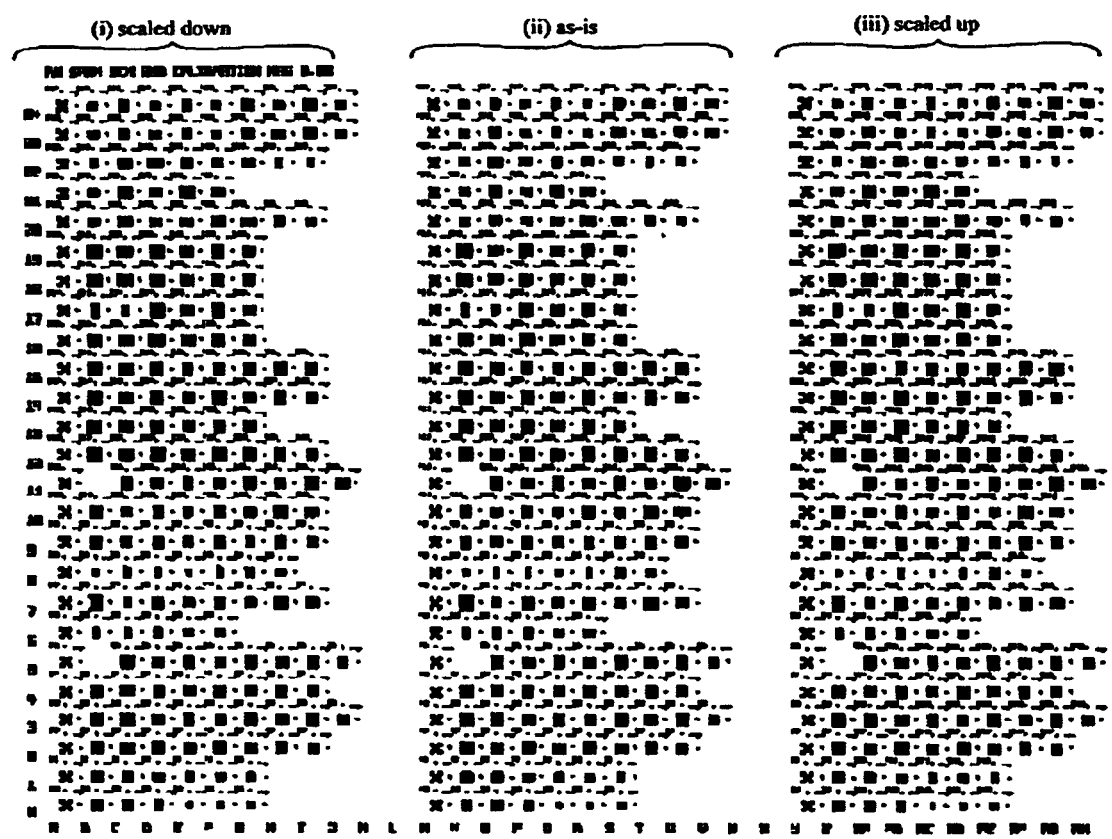
FIG. 5 is a sketch showing an exemplary layout containing arrayed calibration patterns on a metal level (Mx), for the model-based OPC technique of the present invention.

According to an aspect of the invention, clips are collected from a real design, resulting in a collection of many clips, such as are shown in FIG. 5.

Figure 6:
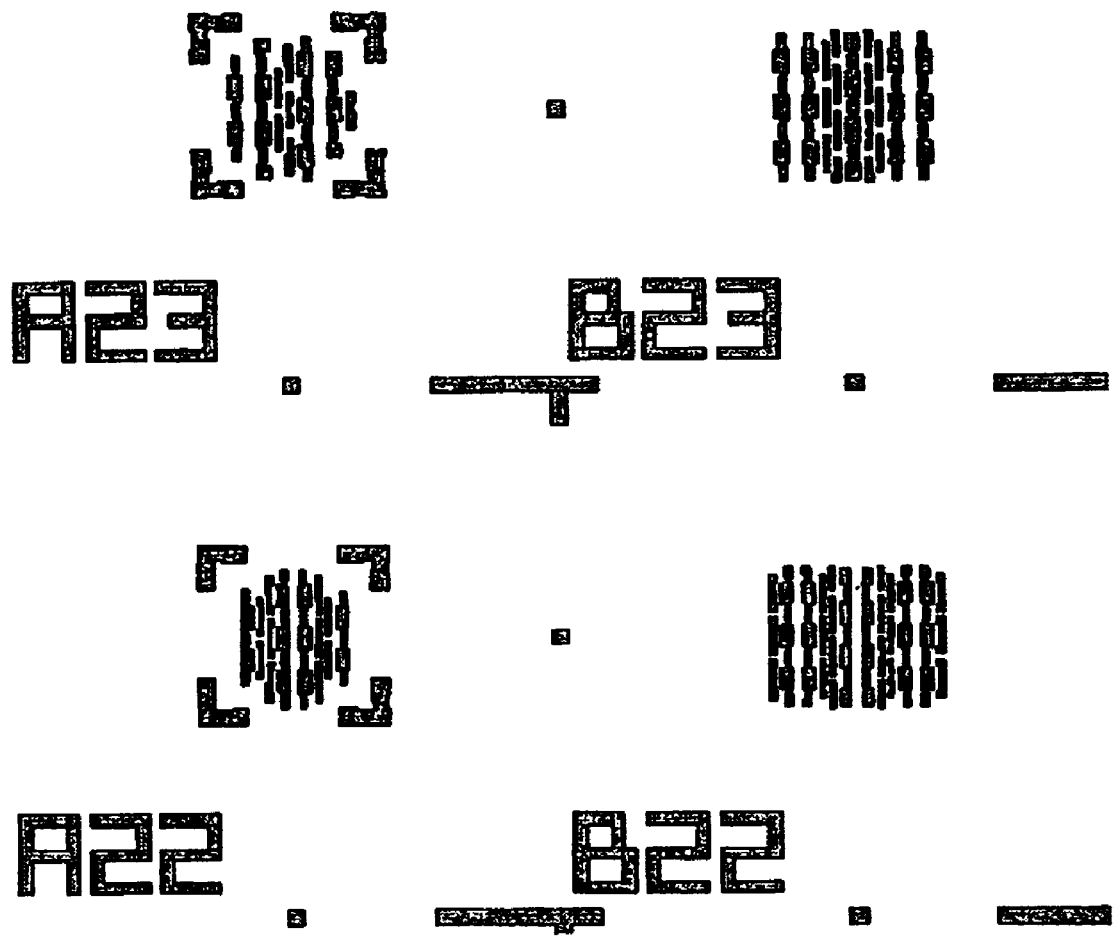
FIG. 6 is a detailed view of a portion of FIG. 5.

FIG. 5 is a collection of many such clips, collected from a real chip design, presented in an array of rows and columns. FIG. 6 is an enlarged view of some of the clips from FIG. 5.

In FIGS. 5 and 6 the basic shapes are all the same, but they are shrunk or expanded, varying dimensions, to provide more data. Each little square is a test pattern.

FIG. 5 illustrates three arrays of exemplary test patterns created from clips that may be symmetrized. Whereas FIG. 5 represented patterns as-designed, the test patterns in FIG. 6 have been OPC modified.

FIG. 6 shows how to take a pattern clip and center it on a particular cell in the array. A cell is an area defined within which a single calibration pattern can exist. This enables the pattern to be measured easily, as it can be found easily on the wafer. FIG. 4 shows a collection of these clips in an array.

Using an array of test patterns such as is shown in FIG. 5, MEEF (mask error enhancement factor) can be can measured, which helps train the model.

A set of calibration structures can be made for each key SRAM. FIG. 4 is an example for gates (PC), FIG. 7 is an example for active area (RX).

The calibration patterns may be made with a routine to import a symmetrized layout into the calibration test mask centering on the extents of the small layout enabling measurement. The verification patterns may use an asymmetrical small layout taken from the SRAMs and having marker shapes were each measurement might be placed as shown in FIG. 3. A test cell may then be made auto-centered on said markers. A matrix of structures may be generated for each significant level: a CA (contact) example is shown in FIG. 4.

FIG. 5 illustrates a calibration array showing SRAM-based test patterns in (i) scaled down such as 10% (ii) "as is" or original size, and (iii) scaled up such as 10% versions, in sub-arrays, from left-to-right.

In the examples shown in FIG. 5, each row represents an SRAM style, and each column represents a bias after OPC (or after NO_OPC, or possible after any biases applied to the inputs for the OPC TARGET).

In the case of RX, there are also very complex 2D shapes. A library of symmetrized shapes may be made for calibration, non-symmetrized chunks of shapes for verification or SEM calibration and appropriately scale for the target technology.

This approach centers the symmetric shapes on the extent of the entire layout for calibration, or centers the shape on one particular shape to enable a measurement of a particular feature on an asymmetric layout. Other corner marks may be generated for the purpose of SEM calibration on such structures.

It should be understood that some of the structures may be biased up or down for MEEF experiments and for additional calibration variation. Biasing up or down may be used to make only the lines (or spaces, not both) larger/smaller by a given amount, while keeping the size of the pattern the same. (This is different than scaling or magnification, wherein the entire pattern would be enlarged or shrunk.)

It should be understood that a reduction or a magnification may be added (scaling may be performed). The routines may have a magnification or reduction term which allows generation of calibration shapes when early advances technologies may not have a plentitude of layouts yet and a scale of old calibration designs from that is appropriate and useful.

In addition, being able to scale smaller or larger allows library elements in one technology to make design styles for other scaled down technologies, but also may be used scaled up putting possibly newer experimental designs back in older calibrations. For example, an SRAM calibration or verification target in 45 nm might be scaled down to use for calibration in 32 nm, but also might be scaled up to use for 65 nm or 90 nm. Similarly, any SRAM calibration or verification macro may be scaled to any target technology to generate a fuller calibration set for that layer. As used herein, a "macro" is a test pattern array, and a "target" is the desired size on the wafer.

For example, the structures may have been put on PC RX M1/MX and CA for 45 nm, and the same set scaled by 75% 70% and 65% to generate a set of structures for 32 nm. RX and M1/MX being the most complex 2D shapes that are impractical to generate from a program and a method such as this to import and center small pieces of a calibration is preferable.

Currently based on calibrations with M1/MX, it is estimated that the model fitting for SRAMs improves by about 33% using these types of structures in the calibration set.

FIG. 6 is a magnified view of a portion of FIG. 5, showing four test patterns.

A22 is a test pattern of for an SRAM design.
A23 is another test pattern of for an SRAM design.
B23 is another pattern of an SRAM design.
B22 is another pattern of an SRAM design.

The "A" patterns have corner markers since they are used for SEMcal, which requires corner markers.

The reason for having both an OPC and a NO_OPC target only is that the test masks may be made with some predictive model and the anchoring may be shifting, and it may not be clear which is preferable, to OPC or generate the OPC target with no edge movement for purposes of a test mask. Having three columns with (i) a negative bias after OPC, (ii) no bias after OPC and (iii) bias after OPC allow for empirical MEEF measurements to be conducted in different areas for SRAMs or other 2D structures.

Each of the test patterns in FIG. 5 is slightly different than one another. For example, there may be 20-30 different types of these test patterns on a given chip, each having differences in design.

In FIG. 6, four corner markers are shown around the test pattern A23, and around the test pattern A22. There is a little "clip" (piece) of a design inside four corners. The corners make it easier for a measurement tool to find it. The test patterns A22 and A23 are clips of two different SRAMs.

The column A patterns have corner markers, as they are used for SEMcal. The column B patterns do not have corner markers, as they are used for conventional calibration. Each of these patterns is clipped and created from different SRAM layouts.

According to the method disclosed herein, first you look at a complex layout. Then, find a difficult region. Then clip a piece of the layout, and make it symmetric. Notice that A22 and A23 are not symmetric. B22 and B23 are symmetrized versions of A22 and A23.

FIG. 6 shows four test patterns of PC for four different SRAM designs, labeled A22, A23, B22, B23. In contrast with FIG. 3, it can be seen here that the design is getting more complex.

The clips shown at A22 and A23 are for two different SRAM designs. Corner markers are inserted, around the clips, to make it easier to locate the clips. These clips may be used for contour (outline) calibration.

The clips shown at B22 and B23 are for two different SRAM designs.

According to an aspect of the invention, a piece of a design is clipped, and is then made symmetric, so that the software can simulate it. This is shown in FIG. 7.

According to an aspect of the invention, a real chip design can be made into a calibrated pattern. Real layouts are clipped, then may be made symmetric, while at the same time not losing the information that it has (the uniqueness of the design). It is desired to maintain the complexity of the design, without losing the uniqueness. Clipping can be done in a few different ways. FIG. 7 shows how you can clip the layout and make it into a symmetric test pattern. A software (SW) routine goes in to a clip and tries to find the center. Then, if the design is not symmetric, the software alters it to make it symmetric. This may, for example, involve adding an extra element such as a line to make the design symmetric around the center (having reflectional symmetry in at least two orthogonal axes).

For example, consider a design comprising a square (the center of the design), with two lines disposed to the right of the square and one line disposed to the left. Symmetry is lacking. The software would add another line on the left of the center square, so that the test pattern will be symmetric. When that gets printed, gets printed with the extra line. So, the original design is altered, trying to stay as close as possible to the original design.

FIG. 7 shows a clip after it is centered. The clip may not have been altered, but may be moved such that the center of the test pattern is in the center of the cell in the array. Generally, the test patterns need to be centered. Calibration arrays are laid out such that the measurement location is in the center of each test pattern. This facilitates easy location and measurement of these test patterns. Since conventional calibration is based on a single measurement in each test pattern—it is important for that point to be easily identified.

According to an aspect of the invention, after symmetrizing the test pattern, expanded and shrunk versions of it may be generated, added to a library of designs, and then used for calibration ("teaching" the model). According to an aspect of the invention, a plurality of SRAM structures may be generated using a software routine. Alternatively, different symmetrized SRAMs pieces may be imported from a previously-built library. These pieces may be scaled up down from their original size (such as 45 nm) to generate a calibration set for 65 nm or 32 nm as another use case.

This allows for the creation of a complex collection of 2D SRAM structures useful for SEM calibration for model-based OPC, conventional calibration for model-based OPC, verification, and also for calibrations for simulation-based approaches.

Moreover, one skilled in the art would be able to apply these approaches using transformations of images from design data and in some cases might synthesize patterns directly by software. One skilled in the art might take a point in the center of two features or between two features and generate symmetric calibration patterns, either taking only left or right and mirroring the data or even using Boolean union or intersection operations on the left and right side unionizing or intersecting the mirror image with the non mirrored image. Similarly one skilled in the art might take one quadrant of the image and mirror it left and right and then up and down to produce a calibration pattern symmetric in both horizontal and vertical directions. One skilled in the art may also write software routines with synthesis approximations to the two dimensional patterns where the patterns are sufficiently simple to be tractable and synthetically generate images imitating the patterns. One skilled in the art may take the calibration patterns of one technology and scale and transform them, applying design rule cleanups or shrinking them appropriately for early investigations of a future technology.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of training an Optical Proximity Correction (OPC) model comprising the steps of:
   symmetrizing a complex design to be a test pattern having orthogonal symmetry;
   providing a plurality of complex test patterns representative of real chip designs;
   printing the test patterns on a wafer;
   measuring the test patterns;
   comparing real chip original design with the measurements;
   using the results of the comparison to calibrate the OPC model;
   clipping the test patterns from real designs, thereby forming one or more clips; and
   symmetrizing the clips;
   wherein the step of symmetrizing comprises the steps of:
   finding the center of the clip; and
   if the clip is not symmetric, altering it to make it symmetric.

2. The method of claim 1, further comprising the step of:
   after symmetrizing the test pattern, biasing it up or down and adding biased versions of it to a library of symmetrized test patterns.

3. The method of claim 1, further comprising the step of:
   after symmetrizing the test pattern, adding expanded and shrunk versions of it to a library of symmetrized test patterns.

4. The method of claim 1, further comprising the step of:
   selecting the real chip designs as SRAMs.

5. A method of training an Optical Proximity Correction (OPC) model comprising the step of:
   symmetrizing a complex design to be a test pattern having orthogonal symmetry, wherein the step of symmetrizing comprises the steps of:
   establishing an axis of symmetry passing through the design, thereby dividing the design into two portions;

deleting one of the two portions; and mirror-imaging the other of the two portions about the axis of symmetry.

6. The method of claim 5, further comprising the steps of:

establishing a second axis of symmetry, orthogonal to the first axis of symmetry and passing through the design, thereby dividing the design into second two portions;

deleting one of the second two portions;

minor-imaging the other of the second two portions about the axis of symmetry.

7. The method of claim 5, the step of:

passing the axis of symmetry through elements of the design.

8. The method of claim 5, further comprising the step of:

rotating the test pattern.

9. The method of claim 5, further comprising the step of:

scaling the test pattern.

* * * * *